United States Patent [19]

Lindsay

[11] Patent Number: 5,023,747
[45] Date of Patent: Jun. 11, 1991

[54] METER BASE SURGE SUPPRESION SYSTEM

[75] Inventor: Roger K. Lindsay, Salt Lake City, Utah

[73] Assignee: EFI Electronics Corporation, Salt Lake City, Utah

[21] Appl. No.: 508,927

[22] Filed: Apr. 12, 1990

[51] Int. Cl.⁵ .............................................. H02H 3/20
[52] U.S. Cl. ..................................... 361/117; 361/56; 361/111; 361/127; 361/366
[58] Field of Search .................. 361/56, 91, 111, 117, 361/118, 126, 127, 366, 367

[56] References Cited

U.S. PATENT DOCUMENTS

| | | | |
|---|---|---|---|
| 4,866,560 | 9/1989 | Allina | 361/117 X |
| 4,872,081 | 10/1989 | Murphy et al. | 361/118 |
| 4,901,187 | 2/1990 | Allina | 361/127 X |

*Primary Examiner*—Derek S. Jennings
*Attorney, Agent, or Firm*—Thorpe, North & Western

[57] ABSTRACT

A meter base surge suppression system is mountable on a meter mounting panel and is adapted to receive and hold a conventional electric meter. The surge suppression system includes a base plate having a plurality of openings through which contact prongs may be inserted, and an electrical contact element disposed about one of the openings for making electrical contact with a prong inserted through the opening. A surge suppression device is disposed on an upper side of the base plate and is coupled between the contact element and ground potential. A receiving plate is mountable on the base plate and is adapted to receive and hold a conventional electric meter. The receiving plate includes a plurality of buss elements which extend downwardly through the receiving plate and through the openings in the base plate to engage and be received into prong receptacles of a meter mounting panel on which the urge suppression system is mounted. The buss elements also include clips for receiving and holding the prongs of an electric meter mounted on the receiving plate.

13 Claims, 3 Drawing Sheets

METER BASE SURGE SUPPRESION SYSTEM

BACKGROUND OF THE INVENTION

1. Field of the Invention

The present invention relates to a surge suppression system and more particularly to the employment of such a system in a base structure for a conventional electric meter.

A wide variety of electrically powered appliances and equipment are in present use today in both the home, office, factory, etc. These appliances and equipment are oftentimes quite expensive, being used to perform and support the performance of vital activities. Examples of such appliances and equipment include personal computers and larger business or scientific computers, medical systems, monitors and instruments used in providing health care, various home appliances, televisions and other video display systems, etc. In fact, society has come to depend on the proper and accurate functioning of such appliances and equipment to the extent that any interruption of the use thereof can be at best only inconvenient and to some extent costly, and at worst life threatening. For this reason, there is a continuing interest in developing devices for protecting against disruption of and damage to such appliances and equipment.

Examples of the type of occurrences which could disrupt the operation of an electrical system and cause damage thereto include electrical noise, voltage sags and surges, and transients. Each of these types of "disturbances" is well known in the electrical system protection field and are discussed in detail in U.S. Pat. No. 4,630,163.

Although the types of electrical disturbances mentioned above are generally of greatest concern for users of electrical systems such as computers, medical equipment, communication equipment, etc., there is still a desire and need for protecting against such electrical disturbances from reaching electrical distribution systems of homes, business offices, and like facilities. It would be desirable, for example, if such electrical distribution systems could be easily and simply adapted to protect against electrical disturbances reaching any appliances or equipment which might be connected to the distribution systems, and thereby obviate the need for providing protection devices for each individual piece of equipment connected to the distribution system.

SUMMARY OF THE INVENTION

It is an object of the invention to provide a system for protecting electrical distribution systems, and the appliances and equipment connected thereto, of homes, offices, and other facilities using typical power sources.

It is another object of the invention to provide such a system which may be easily and simply installed in existing electrical distribution systems.

It is a further object of the invention to provide such a system which may be installed at an input point of such electrical distribution systems adjacent conventional electricity metering devices.

It is still another object of the invention to provide such a system which may be plugged into a conventional meter mounting panel and which may serve as a meter base into which a conventional electric meter may be plugged.

It is an additional object of the invention to provide such a system which may be interposed between a conventional electric meter and a conventional meter mounting panel without requiring any additional special wiring.

The above and other objects of the invention are realized in an illustrative embodiment of a meter base surge suppression system which is mountable on a conventional meter mounting panel having a plurality of prong receptacles for receiving and holding the prongs of a conventional electric meter. The mounting panel would be coupled to an electrical distribution system to which power was to be delivered. The meter base surge suppression system includes a base plate having a plurality of openings through which contact prongs may be inserted, and an electrical contact element disposed about one of the openings for making electrical contact with a prong inserted through the opening. The system also includes a surge suppression device disposed on an upper side of the base plate and coupled between the contact element and ground potential. A receiving plate is mountable on the base plate for receiving and holding a conventional electric meter. The receiving plate includes a plurality of buss elements, each having a shank prong which extends downwardly from an underside of the receiving plate and through a corresponding opening in the base plate when the receiving plate is mounted on the base plate. Such shank prong is to be inserted into a corresponding one of the prong receptacles of the meter mounting panel to enable mounting the base plate on the meter mounting panel. Each buss element also includes a clip which extends upwardly from an upper side of the receiving plate for receiving a corresponding prong of an electric meter. The buss elements are thereby capable of carrying electrical current between the meter prongs plugged into the buss element clips and the shank prongs which are plugged into corresponding meter mounting panel prong receptacles.

In accordance with one aspect of the invention, the base plate also includes a ground terminal disposed to project from an underside of the base plate for contacting a grounding element of the meter mounting panel when the base plate is mounted on the meter mounting panel. The surge suppression device is coupled between the contact element and the ground terminal of the base plate.

Although the illustrative embodiment of the meter base surge suppression system described above is constructed in two parts—a base plate and receiving plate—a single, unitary base receptacle could be provided for mounting on the meter mounting panel and for receiving and holding an electric meter.

BRIEF DESCRIPTION OF THE DRAWINGS

The above and other objects, features and advantages of the invention will become apparent from a consideration of the following detailed description presented in connection with the accompanying drawings in which.

DETAILED DESCRIPTION

Figure 1:
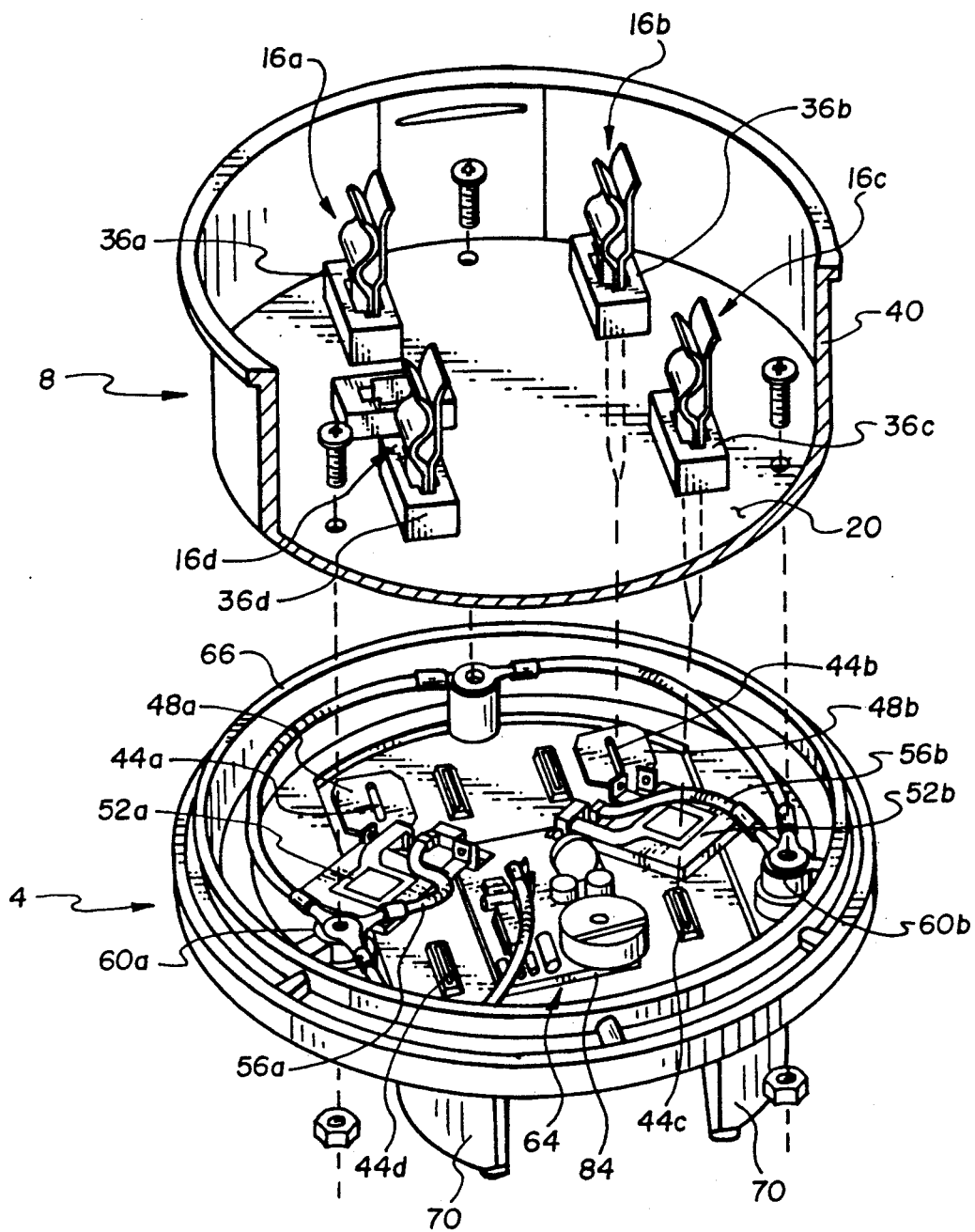
FIG. 1 shows an isometric, exploded, partially cross-sectional view of a meter base surge suppression system made in accordance with the principles of the present invention.
Figure 2:
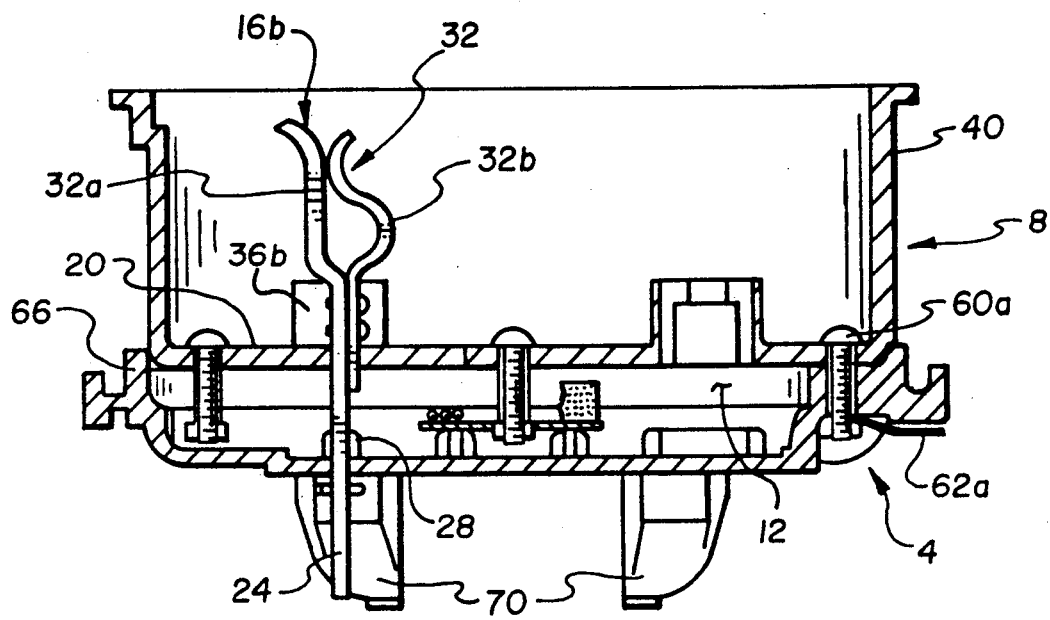
FIG. 2 is a side, cross-sectional view of the meter base surge suppression system of FIG. 1.
Figure 3:
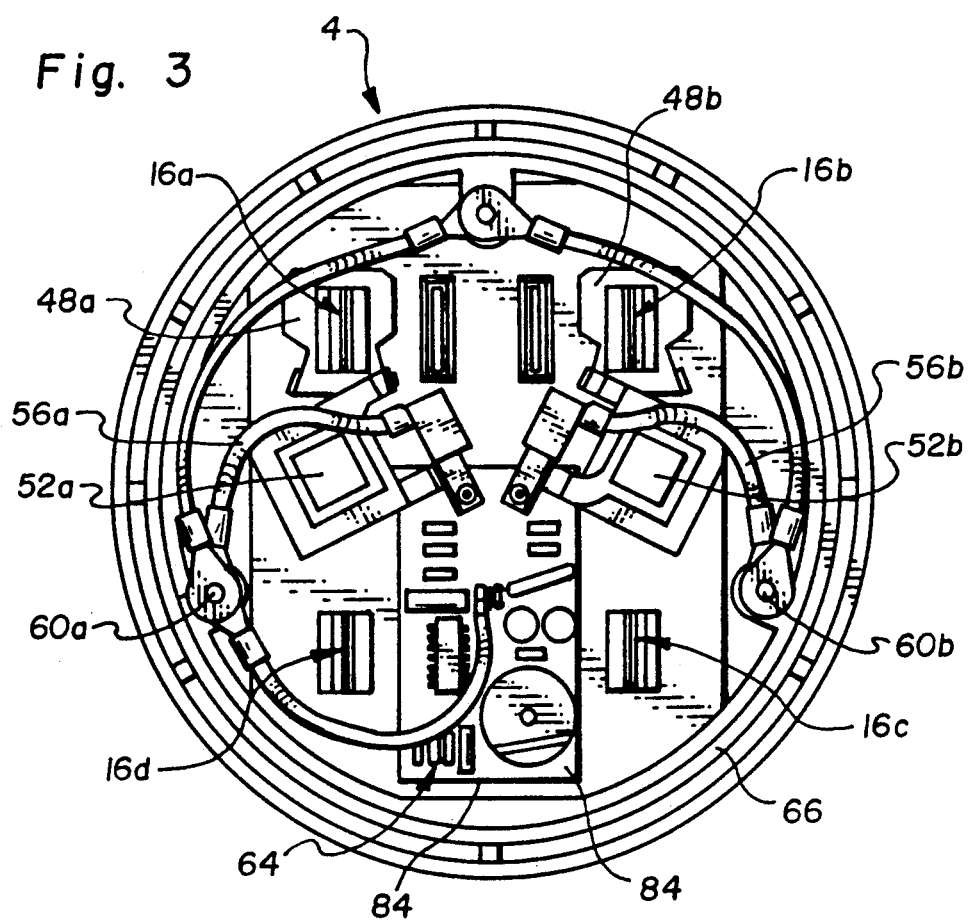
FIG. 3 is a top plan view of the base plate and circuitry of the meter base surge suppression system of FIG. 1.

Referring to FIGS. 1-3, there is shown a meter base surge suppression system which includes a two-part housing or assembly having a base plate 4 and a receiving plate or cup 8. The base plate 4 and receiving plate 8 are dimensioned to enable mounting the receiving plate on the base plate, as best seen in FIG. 2, to define a compartment 12 between the base plate and receiving plate. Electrical circuitry, as will be described momentarily, is disposed in this compartment to perform certain electrical surge suppression and diagnostic functions.

The combination base plate 4 and receiving plate 8 are adapted for mounting on a conventional meter mounting panel or service panel in the same manner that a conventional electric meter would be mounted. That is, a plurality of prongs similar to those projecting from the bottom of a conventional electric meter are provided to project from the underside of the base plate 4 to allow inserting the prongs into prong receptacles of the meter mounting panel.

The receiving plate 8 of the housing or assembly is adapted for receiving and holding a conventional electric meter. In particular, a plurality of buss elements 16a, 16b, 16c and 16d are mounted on a bottom wall 20 of the receiving plate. Each buss element includes a shank prong, such as shank prong 24 of the buss element 16b of FIG. 2, which extends downwardly from the underside of the bottom wall 20, through an opening (such as opening 28 shown in FIG. 2) of the base plate 4 to a location below the base plate. Each buss element also includes a clip 32 which extends upwardly from the upper side of the bottom wall 20 of the receiving plate 8 to allow receiving a corresponding prong of an electric meter which may be plugged into the receiving plate. The clip 32 is of conventional construction to include a more rigid strip of conductive material 32a and a resilient conductive strip of material 32b. The strip of material 32b is attached to the strip of material 32a which extends downwardly through the bottom wall 20 of the receiving plate 8 to form the shank prong 24, as seen in FIG. 2. Insulative support blocks 36a, 36b, 36c and 36d provide support for respective buss elements and allow for mounting the buss elements in the bottom wall 20 of the receiving plate 8.

A side wall 40 projects upwardly from the perimeter of the bottom wall 20 to circumscribe, at least partially, an electric meter which would be plugged into the receiving plate 8. The receiving plate 8 could illustratively be made of structural grade plastic, as could the base plate 4.

Formed in the base plate 4 are a plurality of openings or slits 44a, 44b, 44c and 44d, dimensioned for snugly receiving a corresponding shank prong of the buss elements 16. Two electrical contact elements 48a and 48b are disposed on the base plate 4 to surround a respective opening 44a and 44b and make electrical contact with a shank prong inserted into the openings. The contact elements 48a and 48b are formed of a generally flat, flexible metallic alloy plate having an opening or slit to allow insertion therethrough of a shank prong of a buss element. The contact elements thus serve as a collar to surround the prongs. These contact elements 48a and 48b allow for electrically connecting other circuitry, which will be disposed on the base plate 4, to the shank prongs which are inserted into the openings 44a and 44b without special wiring. This circuitry includes two metal oxide varistors 52a and 52b to contact elements 48a and 48b respectively. The metal oxide varistors 52a and 52b are also electrically coupled to fuses 56a and 56b respectively, which are coupled to grounding terminals 60a and 60b respectively. The metal oxide varistors 52a and 52b are also coupled to diagnostic circuitry 64, shown in greater detail in FIG. 4. The grounding terminals 60a and 60b (and also 60c) constitute bolts, such as bolt 60a of FIG. 2, which extend through the base plate 4 to the underside thereof. Contact strips, such as strip 62a of FIG. 2 are disposed in contact with respective bolts to extend outwardly therefrom to contact a grounding ring of a meter mounting panel on which the base plate 4 is mounted. In this manner, the need for special grounding wiring is avoided.

The base plate 4 is formed with an upwardly turned perimeter lip 66 for receiving and holding therewithin the bottom wall 20 of receiving plate 8. Extending downwardly from the underside of the base plate 4 are feet 70, similar to the feet on an electric meter, for maintaining the base plate a predetermined distance from a meter mounting panel on which the base plate might be mounted.

Figure 4:
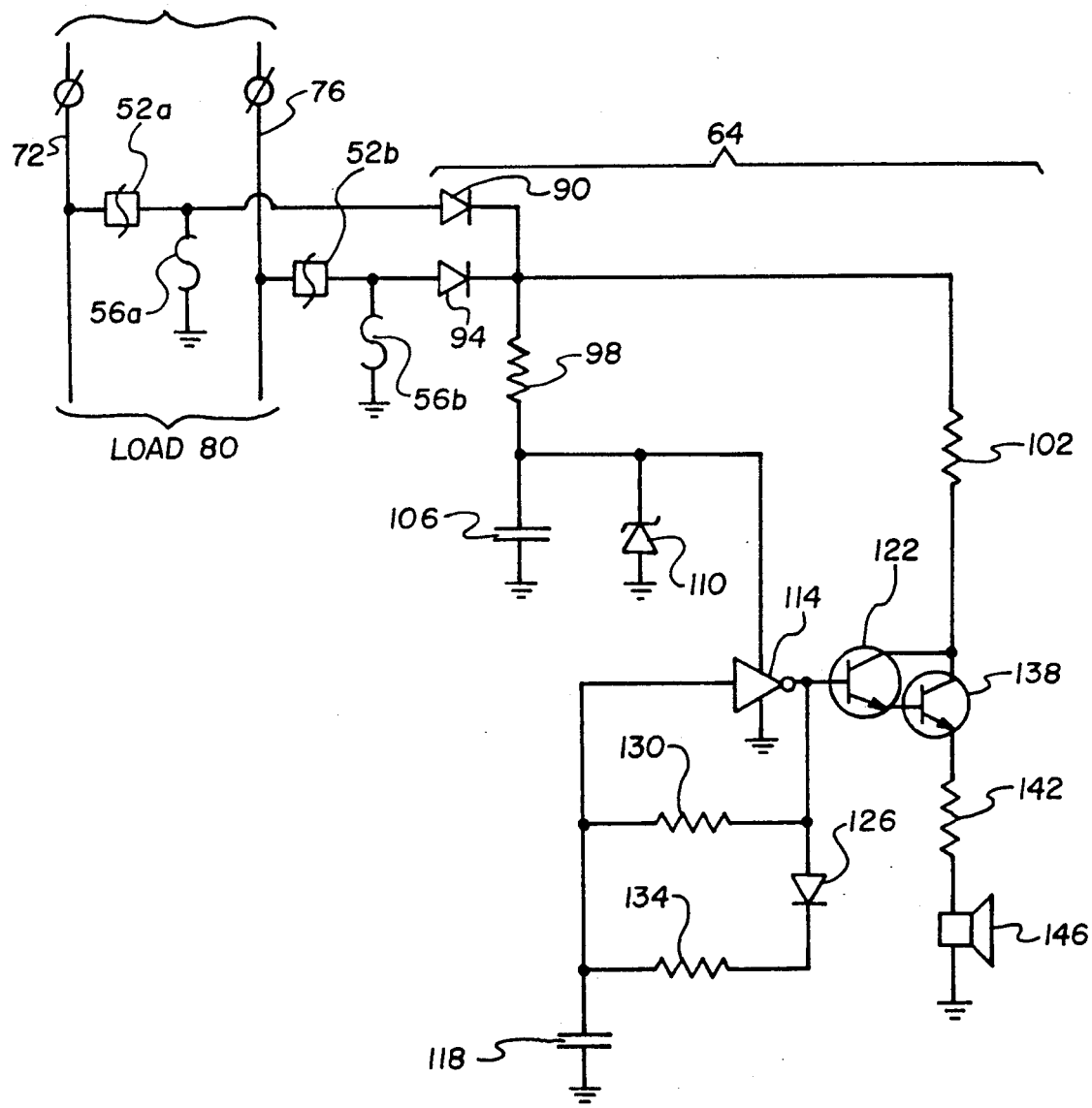
FIG. 4 is a schematic of a surge suppression and diagnostic circuit suitable for use in the present invention.

The metal oxide varistors 52a and 52b are formed to have a generally flat, planar profile to provide better heat dissipation and yet be compact. The metal oxide varistors provide for electrical surge protection against surges which are present on buss elements 16a and 16b, in a conventional fashion. Such surges are conducted via the metal oxide varistors to respective fuses and then to ground to prevent the surges from being transmitted onto the load, electrical distribution system, or the like to which the meter mounting panel (on which the meter base surge suppression system of the invention is mounted) is connected. This is best seen in FIG. 4 which shows a conventional single or multi-phase AC power source 68 coupled by lines 72 and 76 to metal oxide varistors 52a and 52b respectively, and also to a load 80. The diagnostic circuitry 64 is coupled to the juncture between the metal oxide varistors and corresponding fuses, as also shown in FIG. 4. This diagnostic circuitry 64 is mounted on a circuit board 84 which, in turn, is disposed on the base plate 4 as best seen in FIGS. 1 and 3.

Referring to FIG. 4, the diagnostic circuit 64 includes diodes 90 and 94 for coupling the circuit to respective metal oxide varistors 52a and 52b. The diodes 90 and 94 are both coupled to resistors 98 and 102, with resistor 98 being coupled to a capacitor 106 and a Zener diode 110, which are connected in parallel. The resistor 98 is also coupled to a Schmitt trigger 114 whose input is coupled to a capacitor 118 and whose output is coupled to the base of a transistor 122 and to a diode 126. Resistors 130 and 134 are each coupled to the capacitor 118 and to the input and output of the Zener diode 126 respectively. The emitter of the transistor 122 is coupled to the base of another transistor 138, and the collector of the transistor 122 is coupled to the collector of the transistor 138. The emitter of the transistor 138 is coupled to a resistor 142 which, in turn, is coupled to an audible signal generator such as a buzzer 146.

The diagnostic circuitry 64 described above operates to intermittently supply current to the buzzer 146, to cause it to emit an audible signal when one of the fuses 56a or 56b ruptures. This alerts the user that one of the fuses 52a or 52b has ruptured. This would occur, for example, when an electrical surge which exceeded a certain level was passed through a corresponding metal oxide varistor to the fuse in question which, because of the magnitude of the surge, is caused to rupture rather than to conduct the surge to ground. Upon rupture of the fuse, current flows not through the fuse ground but rather to the diagnostic circuit 64 to initiate operation of the circuit.

The diagnostic circuit 64 operates as follows. Current flows via diodes 90 and 94 and resistor 98 to charge the capacitor 106. The capacitor 106 thus acts as a D.C. power source for the other circuitry. Current also flows via the Schmitt trigger 114 to charge capacitor 118. When the capacitor reaches a certain charge level, the Schmitt trigger 114 "triggers" to thereby turn on transistors 122 and 138 so that current flows to the buzzer 146. The buzzer then operates. After the Schmitt trigger 114 is "triggered," the capacitor 118 discharges, the Schmitt trigger 114 resets, the capacitor 118 begins to charge again, and the cycle is repeated.

In the manner described, surge protection is provided in a meter base housing which may be easily plugged into a meter mounting panel, and then into which a conventional electrical meter may be plugged. When the base plate 4 and receiving plate 8 are assembled (prior to plugging into a meter mounting panel), the buss elements 16a and 16b automatically connect with contact elements 48a and 44b respectively without requiring special wiring. This effectively connects the power supply line or source with the metal oxide varistors 52a and 52b, fuses 56a and 56b, and diagnostic circuitry 64. By connecting fuses 56a and 56b directly to grounding terminals 60a and 60b respectively, the grounding terminals 60a and 60b automatically engage the meter mounting panels ground ring when the base plate 4 is mounted on a meter mounting panel. The fuses are thus grounded without requiring special hookup of grounding wires.

It is to be understood that the above-described arrangements are only illustrative of the application of the principles of the present invention. Numerous modifications and alternative arrangements may be devised by those skilled in the art without departing from the spirit and scope of the present invention and the appended claims are intended to cover such modifications and arrangements.

I claim:

1. A meter base surge suppression system mountable on a meter mounting panel having a plurality of prong receptacles for receiving and holding the prongs of an electric meter, said mounting panel being coupled to an electrical load, said system comprising
   a base plate having a plurality of openings through which contact prongs may be inserted, and an electrical contact element disposed by one of the openings for making electrical contact with a prong inserted through said one opening,
   surge suppression means disposed on an upper side of the base plate and coupled between the contact element and ground potential, and
   a receiving plate mountable on the base plate and on which an electric meter may be mounted, said receiving plate including a plurality of buss means each having
      a shank prong which extends downwardly from an underside of the receiving plate and through a corresponding opening in the base plate when the receiving plate is mounted on the base plate, for insertion into a corresponding one of the prong receptacles of the meter mounting panel, and
      a clip which extends upwardly from an upper side of the receiving plate for receiving a corresponding prong of an electric meter.

2. A system as in claim 1 wherein said surge suppression means comprises
   a metal oxide varistor, one side of which is coupled to the contact element,
   a fuse coupled between the other side of the varistor and ground potential, and
   diagnostic means coupled to the junction between the varistor and fuse for producing an audible signal when the fuse ruptures in response to an electrical current surge impressed upon the contact element which exceeds a predetermined level.

3. A system as in claim 2 wherein said diagnostic means comprises an audible signal generator for generating an audible signal in response to receipt of electrical current, and timing means for periodically supplying electrical current to said audible signal producing means after rupture of the fuse.

4. A system as in claim 3 wherein said audible signal generator comprises a buzzer.

5. A system as in claim 2 wherein said metal oxide varistor is formed to have a generally flat planar profile, and is disposed on the base plate to be generally parallel therewith.

6. A system as in claim 1 wherein said base plate further includes a ground terminal disposed to project from an upper side of the base plate to an underside thereof for contacting a grounding ring of the meter mounting panel when the system is mounted on the meter mounting panel, and wherein said surge suppression means is coupled between the contact element and said ground terminal on the upper side of the base plate.

7. A system as in claim 1 wherein said receiving plate comprises a bottom wall on which the buss means is disposed, and a side wall which projects upwardly from an upper side and perimeter of the bottom wall to circumscribe at least a portion of an electric meter mounted on the receiving plate.

8. A system as in claim 1 wherein said contact element comprises a flexible collar made of a conductive material and disposed to substantially surround said one opening and contact a prong inserted therethrough.

9. A system as in claim 1 wherein first and second meter mounting panel prong receptacles are adapted to receive electrical current, and wherein said base plate includes first and second contact elements disposed by first and second openings respectively of the base plate for making electrical contact with respective prongs inserted through the first and second openings, wherein said system includes first and second surge suppression means disposed on an upper side of the base plate, each coupled between first and second contact elements respectively and ground potential, and wherein the shank prongs of first and second buss means pass through said first and second openings for insertion into said first and second prong receptacles when the system is mounted on the meter mounting panel.

10. A system as in claim 9 wherein said surge suppression means comprises
   first and second metal oxide varistors coupled to the first and second contact elements respectively, first and second fuses coupled between first and second varistors respectively and ground potential, and diagnostic means coupled to the junctions between the first varistor and first fuse and second varistor and second fuse, for producing an audible signal when either the first or second fuse ruptures.

11. A transient voltage suppression system mountable on a meter mounting panel having a plurality of prong receptacles into which the prongs of an electric meter may be inserted, and a grounding element disposed adjacent the prong receptacles, said system comprising a housing having a bottom wall and a side wall extending upwardly from the perimeter of the bottom wall, a plurality of buss means for conducting electric current, each having a conductive shank extending from an upper side of the bottom wall through the bottom wall and downwardly from an underside of the bottom wall, said shank being dimensioned for insertion into the prong receptacles of the meter mounting panel to enable mounting the housing on the meter mounting panel, and a conductive clip joined to the shank at the upper side of the bottom wall to project upwardly therefrom for receiving and holding a prong of an electric meter, and transient voltage suppression means disposed at the upper side of the bottom wall and including a grounding terminal extending from the upper side of the bottom wall to the underside thereof for contacting the grounding element of the meter mounting panel when the housing is mounted on the meter mounting panel, and a voltage clamping device coupled between at least one of the buss means and the grounding terminal for conducting current from said one buss means to the grounding terminal when the voltage on said one buss means exceeds a predetermined level.

12. A system as in claim 11 wherein said clamping device comprises a metal oxide varistor and a fuse connected in series, and wherein said system further includes diagnostic means disposed at the upper side of the bottom wall of the housing and coupled to the junction between the varistor and fuse for producing an audible signal when the fuse ruptures.

13. A transient voltage suppression system mountable on a meter mounting panel having a plurality of prong receptacles into which the prongs of an electric meter may be inserted, said system comprising a base means having a bottom wall with a plurality of openings through which an electrical conductive prong may be inserted, and having two electrical contact elements each disposed by a respective one of the openings for making electrical contact with a prong inserted through the respective opening, transient voltage suppression means disposed at an upper side of the bottom wall of the base means and coupled between the two contact elements to conduct current therebetween when the voltage on either one of the contact elements exceeds a certain level, and receiving means mountable on the base means for receiving and holding an electric meter, said receiving means including a plurality of buss means each having a shank which extends downwardly from an underside of the receiving means and through a corresponding opening in the base means when the receiving means is mounted on the base means, for insertion into a corresponding one of the prong receptacles of the meter mounting panel, and a clip which extends upwardly from an upper side of the receiving means for receiving and holding a corresponding prong of an electric meter.

* * * * *